(12) United States Patent
Sawal

(10) Patent No.: US 11,948,077 B2
(45) Date of Patent: Apr. 2, 2024

(54) NETWORK FABRIC ANALYSIS

(71) Applicant: DELL PRODUCTS L.P., Round Rock, TX (US)

(72) Inventor: Vinay Sawal, Fremont, CA (US)

(73) Assignee: DELL PRODUCTS L.P., Round Rock, TX (US)

( * ) Notice: Subject to any disclaimer, the term of this patent is extended or adjusted under 35 U.S.C. 154(b) by 775 days.

(21) Appl. No.: 16/920,345

(22) Filed: Jul. 2, 2020

(65) Prior Publication Data

US 2022/0004865 A1 Jan. 6, 2022

(51) Int. Cl.
*G06N 3/08* (2023.01)
*G06F 30/18* (2020.01)
*G06N 3/04* (2023.01)

(52) U.S. Cl.
CPC ............ *G06N 3/08* (2013.01); *G06F 30/18* (2020.01); *G06N 3/04* (2013.01)

(58) Field of Classification Search
CPC ............ G06N 3/08; G06N 3/04; G06F 30/18
See application file for complete search history.

(56) References Cited

U.S. PATENT DOCUMENTS

| 10,887,182 | B1* | 1/2021 | Xie ......................... H04L 41/12 |
| 2013/0083701 | A1* | 4/2013 | Tomic .................... H04L 12/462 |
| | | | 370/255 |
| 2016/0196480 | A1* | 7/2016 | Heifets ................... G06N 3/088 |
| | | | 382/158 |
| 2021/0256355 | A1* | 8/2021 | Chen ....................... G06N 3/08 |

OTHER PUBLICATIONS

Keith Henderson et al.; "It's Who You Know: Graph Mining Using Recursive Structural Features"; KDD'11, Aug. 21-24, 2011, San Diego, California, USA. (Year: 2011).*
Thomas N. Kipf et al.; "Semi-supervised classification with graph convolutional networks"; Published as a conference paper at ICLR 2017 (Year: 2017).*
Keith Henderson et al.; "RoIX: Structural Role Extraction & Mining in Large Graphs"; KDD'12, Aug. 12-16, 2012, Beijing, China (Year: 2012).*
Shichao Zhu et al.; "Graph Geometry Interaction Learning" ; 34th Conference on Neural Information Processing Systems (NeurIPS 2020) (Year: 2020).*

* cited by examiner

*Primary Examiner* — Rehana Perveen
*Assistant Examiner* — Nupur Debnath
(74) *Attorney, Agent, or Firm* — NORTH WEBER & BAUGH LLP

(57) ABSTRACT

Network fabric design and analysis is generally a manual process where the wiring diagram is manually created and analyzed. Because of the complexity of modern network fabric designs, it has become increasingly more difficult to manually detect potential issues with a network fabric design. Accordingly, embodiments herein help automate the analysis of network fabric designs. In one or more embodiments, a trained neural network model or network models receive as input a wiring diagram and analyzes it. In one or more embodiments, the trained model may generate a real-valued score that represents the quality of the design. In one or more embodiments, the trained neural network may classify a particular issue or issues of the network fabric design.

20 Claims, 15 Drawing Sheets

$$\hat{A} =$$

| | L7 | S1 | L2 | L3 | S2 | L5 | L1 | L8 | L4 | L6 | |
|---|---|---|---|---|---|---|---|---|---|---|---|
| L6 | 0 | 0 | 0 | 0 | 0 | 0 | 0 | 0 | 0 | 3 | L6 |
| L4 | 0 | 0 | 0 | 0 | 0 | 0 | 0 | 0 | 3 | 0 | L4 |
| L8 | 0 | 0 | 0 | 0 | 0 | 0 | 0 | 3 | 0 | 0 | L8 |
| L1 | 0 | 0 | 0 | 0 | 0 | 0 | 3 | 0 | 0 | 0 | L1 |
| L5 | 0 | 0 | 0 | 0 | 0 | 3 | 0 | 0 | 0 | 0 | L5 |
| S2 | 0 | 0 | 0 | 0 | 9 | 0 | 0 | 0 | 0 | 0 | S2 |
| L3 | 0 | 0 | 0 | 3 | 0 | 0 | 0 | 0 | 0 | 0 | L3 |
| L2 | 0 | 0 | 3 | 0 | 0 | 0 | 0 | 0 | 0 | 0 | L2 |
| S1 | 0 | 9 | 0 | 0 | 0 | 0 | 0 | 0 | 0 | 0 | S1 |
| L7 | 3 | 0 | 0 | 0 | 0 | 0 | 0 | 0 | 0 | 0 | L7 |
| | L7 | S1 | L2 | L3 | S2 | L5 | L1 | L8 | L4 | L6 | |

800

For each node in the multigraph, extract features to create a feature vector, $v_i$ — 805

↓

Stack all feature vectors to create a feature matrix $X$ that represents the features from all nodes — 810

FIG. 8

| | F1 | F2 | F3 | F4 | ... | Fd | |
|---|---|---|---|---|---|---|---|
| L7 | | | | | | | L7 |
| S1 | $val_{1,1}$ | ... | ... | ... | ... | $val_{1,d}$ | S1 |
| L2 | $val_{2,1}$ | ... | ... | ... | ... | $val_{2,d}$ | L2 |
| L3 | $val_{3,1}$ | ... | ... | ... | ... | $val_{3,d}$ | L3 |
| S2 | $val_{4,1}$ | ... | ... | ... | ... | $val_{4,d}$ | S2 |
| L5 | $val_{5,1}$ | ... | ... | ... | ... | $val_{5,d}$ | L5 |
| L1 | $val_{6,1}$ | ... | ... | ... | ... | $val_{6,d}$ | L1 |
| L8 | $val_{7,1}$ | ... | ... | ... | ... | $val_{7,d}$ | L8 |
| L4 | $val_{8,1}$ | ... | ... | ... | ... | $val_{8,d}$ | L4 |
| L6 | $val_{9,1}$ | ... | ... | ... | ... | $val_{9,d}$ | L6 |
| | $val_{10,1}$ | | | | | $val_{10,d}$ | |
| | F1 | F2 | F3 | F4 | ... | Fd | |

NETWORK FABRIC ANALYSIS

BACKGROUND

The present disclosure relates generally to information handling systems. More particularly, the present disclosure relates to systems and methods for analyzing the validity or quality of a network fabric design.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The dramatic increase in computer usage and the growth of the Internet has led to a significant increase in networking. Networks, comprising such information handling systems as switches and routers, have not only grown more prevalent, but they have also grown larger and more complex. Network fabric can comprise a large number of information handling system nodes that are interconnected in a vast and complex mesh of links.

Furthermore, as businesses and personal lives increasingly rely on networked services, networks provide increasingly more central and critical operations in modern society. Thus, it is important that a network fabric be well designed and function reliably. However, given the size and complexity of modern network fabrics, it is difficult to ascertain the quality of a network design, particularly when designing the network. Sometimes, it is not until a network design has be implemented and used that it is known whether it was a good design or whether it has issues that affect its validity/quality, such as dependability, efficiency, stability, reliability, and/or expandability. For example, a network may have a network fabric design that can result in a single point of failure or may have a design that inefficiently utilizes the information handling systems of the network.

Accordingly, it is highly desirable to have ways to gauge the quality of a network fabric.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of these embodiments, it should be understood that it is not intended to limit the scope of the disclosure to these particular embodiments. Items in the figures may not be to scale.

FIG. 5 depicts an adjacency matrix, according to embodiments of the present disclosure.

FIG. 6 depicts an example degree matrix for a multigraph, according to embodiments of the present disclosure.

FIG. 8 depicts a method for building a feature matrix, according to embodiments of the present disclosure.

FIG. 10 graphically depicts a feature matrix, according to embodiments of the present disclosure.

DETAILED DESCRIPTION OF EMBODIMENTS

Figure 1:
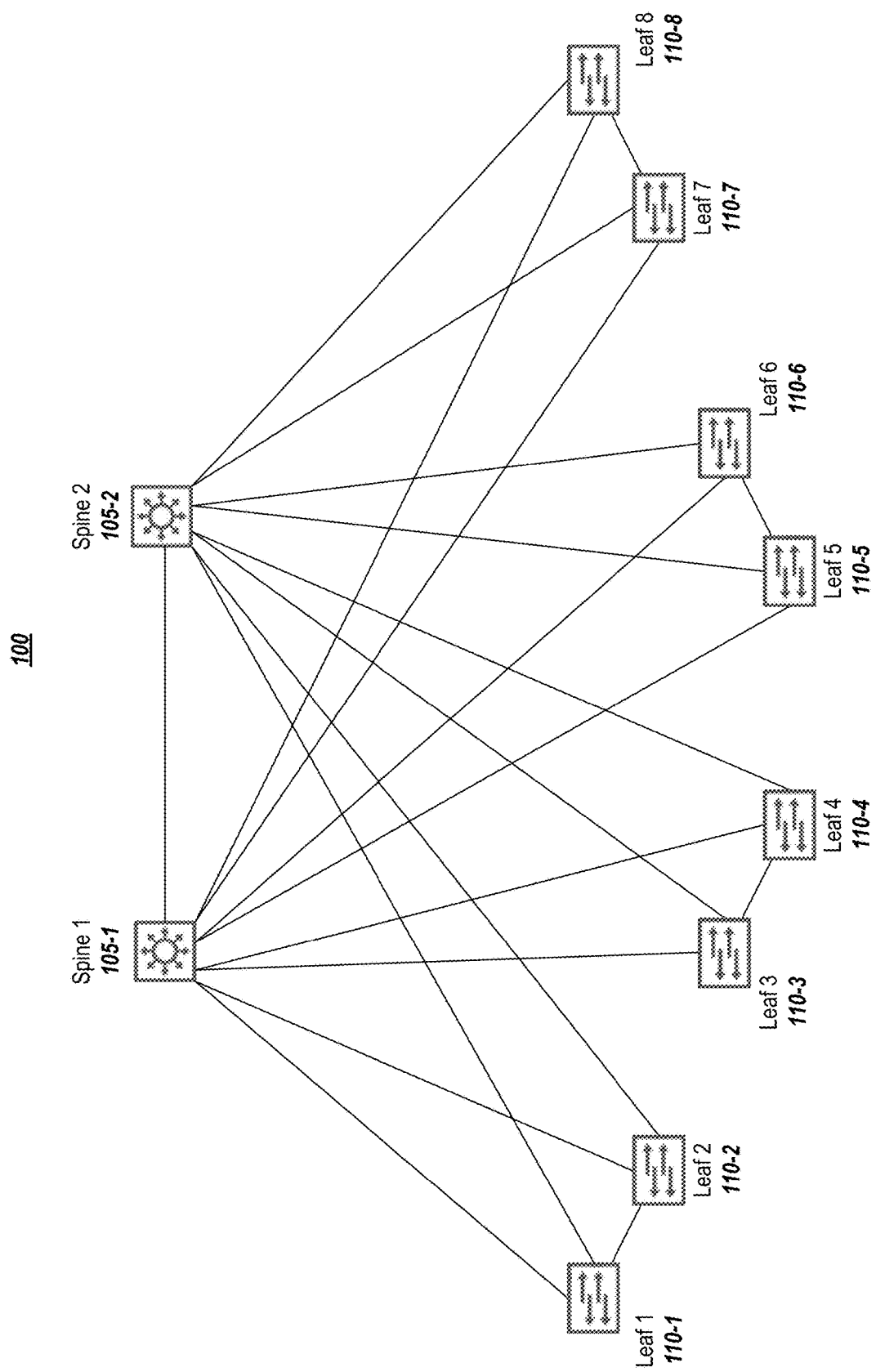
FIG. 1 ("FIG. 1") depicts an example network fabric, according to embodiments of the present disclosure.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including, for example, being in a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledgement, message, query, etc., may comprise one or more exchanges of information.

Reference in the specification to "one or more embodiments," "preferred embodiment," "an embodiment," "embodiments," or the like means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms, and any examples are provided by way of illustration and shall not be used to limit the scope of this disclosure.

A service, function, or resource is not limited to a single service, function, or resource; usage of these terms may refer to a grouping of related services, functions, or resources, which may be distributed or aggregated. The use of memory, database, information base, data store, tables, hardware, cache, and the like may be used herein to refer to system component or components into which information may be entered or otherwise recorded. The terms "data," "information," along with similar terms, may be replaced by other terminologies referring to a group of one or more bits, and may be used interchangeably. The terms "packet" or "frame" shall be understood to mean a group of one or more bits. The term "frame" shall not be interpreted as limiting embodiments of the present invention to Layer 2 networks; and, the term "packet" shall not be interpreted as limiting embodiments of the present invention to Layer 3 networks. The terms "packet," "frame," "data," or "data traffic" may be replaced by other terminologies referring to a group of bits, such as "datagram" or "cell." The words "optimal," "optimize," "optimization," and the like refer to an improvement of an outcome or a process and do not require that the specified outcome or process has achieved an "optimal" or peak state.

It shall be noted that: (1) certain steps may optionally be performed; (2) steps may not be limited to the specific order set forth herein; (3) certain steps may be performed in different orders; and (4) certain steps may be done concurrently.

Any headings used herein are for organizational purposes only and shall not be used to limit the scope of the description or the claims. Each reference/document mentioned in this patent document is incorporated by reference herein in its entirety.

A. General Introduction

Because computer networking is a critical function in modern society, it is important that the design of information handling system nodes and connections (or links), which together form the network fabric, be done well.

Due to the complexity of modern network designs, a number of tools have been created to help in the design, operation, management, and/or troubleshooting of physical & virtual network topologies. One such tool is the Smart-Fabric Director (SFD), by Dell Technologies Inc. (also Dell EMC) of Round Rock, Texas, dramatically simplifies the definition, provisioning, monitoring, and troubleshooting of physical underlay fabrics with intelligent integration, visibility, and control for virtualized overlays. As a part of an initial (i.e., Day-0) deployment, SFD uses a wiring diagram, which may be imported into the system. This wiring diagram may be a JSON (JavaScript Object Notation) object that represents the physical topology to be managed. This JSON file may include such elements as: (1) managed switches (which may also be referred to as fabric elements); (2) managed connections between switches; (3) switch attributes (such as, model type (e.g., Z9264, S4128), role (e.g., spine, leaf, border), etc.; (4) connection attributes: link-id (e.g., ethernet1/1/1), link speed (e.g., 10 G, 100 G), link role (e.g., uplink, link aggregation group (LAG) internode link (also known as a virtual link trunking interface (VLTi))); and (5) other administrative items (e.g., management-IP (Internet Protocol) for switches).

To help generate a wiring diagram, other tools are also available. For example, Dell also provides Dell EMC's Fabric Design Center (FDC) to help create a wiring diagram for a network fabric. Once the wiring diagram has been created, it may be imported into an SFD Controller for deployment.

FIG. 1 depicts an example network fabric that may be generated using a fabric design tool (such as Dell EMC's Fabric Design Center or other tool) as it may be graphically depicted in a networking tool (such as Dell EMC's SFD Controller or other tool), according to embodiments of the present disclosure. The example network fabric 100 comprises two spine nodes 105 and four sets of paired leaf nodes 110.

While these tools aid in generating wiring diagrams and in deploying and managing fabrics, it is not apparent which designs are better than others. Given the vastness and complexity of some network fabrics, it may take experience, actual deployment, or both to gauge whether a network fabric will have issues that affect its validity/quality, such as dependability, efficiency, stability, reliability, and/or expandability.

In addition to fundamental problems with the network fabric design, a number of potential issues can exist in a design. For example, the following non-exhaustive list are issues that can exist in a wiring diagram: (1) missing fabric elements (e.g., missing a border switch); (2) missing one or more connection (e.g., uplink, VLTi, etc.); (3) platform compatibility issues; (4) feature compatibility issues; (5) end-of-life issues with older models; (6) platform capability issues (e.g., a lower-end device with limited capacity should preferably not be used in a key role, such as a spine node); (7) link bandwidth (e.g., not enough bandwidth between a spine-leaf or leaf-leaf).

Fabric analysis is generally a manual process where the wiring diagram is manually analyzed after being created. There may be some rule-based approaches to aid the analysis, but such approaches have limitations on scalability, performance, and adaptability.

Since typical deployment fabrics are CLOS networks, there are some established best practices guidelines on how to build them. For the reasons stated above, it would be very useful to have an analysis tool that can gauge these design level issues prior to deployment.

Accordingly, embodiments herein help automate the analysis of network fabric designs. In one or more embodiments, the analysis functionality may be incorporated into design and/or deployment and management tools. For example, a fabric design center tool may include a feature or features that allows a user to build a fabric (e.g., the "Build Your Own Fabric" section of Dell EMC's FDC) and include a "Fabric Analysis" embodiment that analyzes the wiring diagram. Thus, the Fabric Analysis feature takes a wiring diagram and analyzes it using one or more embodiments as explained in the document. In one or more embodiments, the analysis feature may generate a real-valued score (e.g., 0.0≤score≤1.0) that represents the strength of the design, which score may be assigned to various categories. For example, in one or more embodiment, a qualitative policy may have three categories or classification as follows:
1) GREEN: A score above a certain threshold ($t_h$≤score≤1.0) may be considered as good or acceptable;
2) YELLOW: A score in-between two thresholds ($t_l$≤score≤$t_h$) may be considered cautionary (i.e., usable but with one or more concerns); and
3) RED: A score below a certain threshold (0.0≤score≤$t_l$) may be considered unacceptable.

It shall be noted that different, fewer, or more categories may be used. For example, the set of classes may be associated with certain issues or potential issues with the network fabric. By classifying the issues or potential issues, a network designer or administrator may take one or more corrective actions.

In one or more embodiments, appropriate or corrective actions may include a design audit by an advanced services team (i.e., expert(s) in the field) for new recommendations. The audit may be performed at various degree of complexity and may involve checking for the presence of common issues, for example: (a) checking all devices in the topology for end-of-life date; (b) checking if there is sufficient redundancy in the design (i.e., every leaf/spine is a pair); (c) checking connection bandwidth between leaf-pairs and spine-pairs to ensure sufficiency; (d) checking if a border leaf is present; and (e) checking to see if the devices are being used appropriately based on their capability (i.e., low-end device should not be used as a spine device). Additionally, or alternatively, the one or more corrective actions may involve making a change or changes based upon classification(s) identified by the neural network system.

B. System and Method Embodiments

1. Training Embodiments

Figure 2:
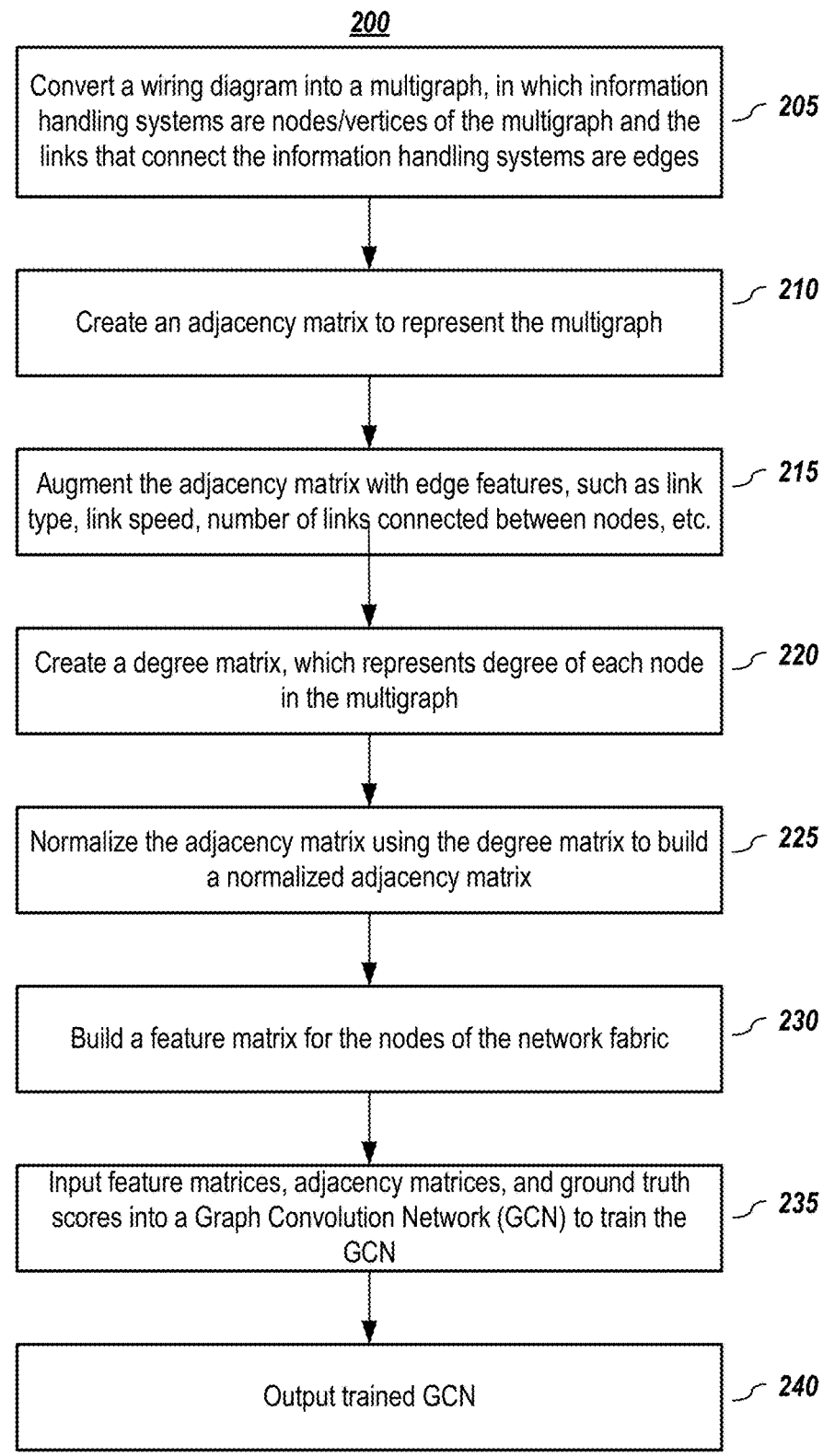
FIG. 2 depicts a method for training a neural network to analyze a network fabric, according to embodiments of the present disclosure.
Figure 3:
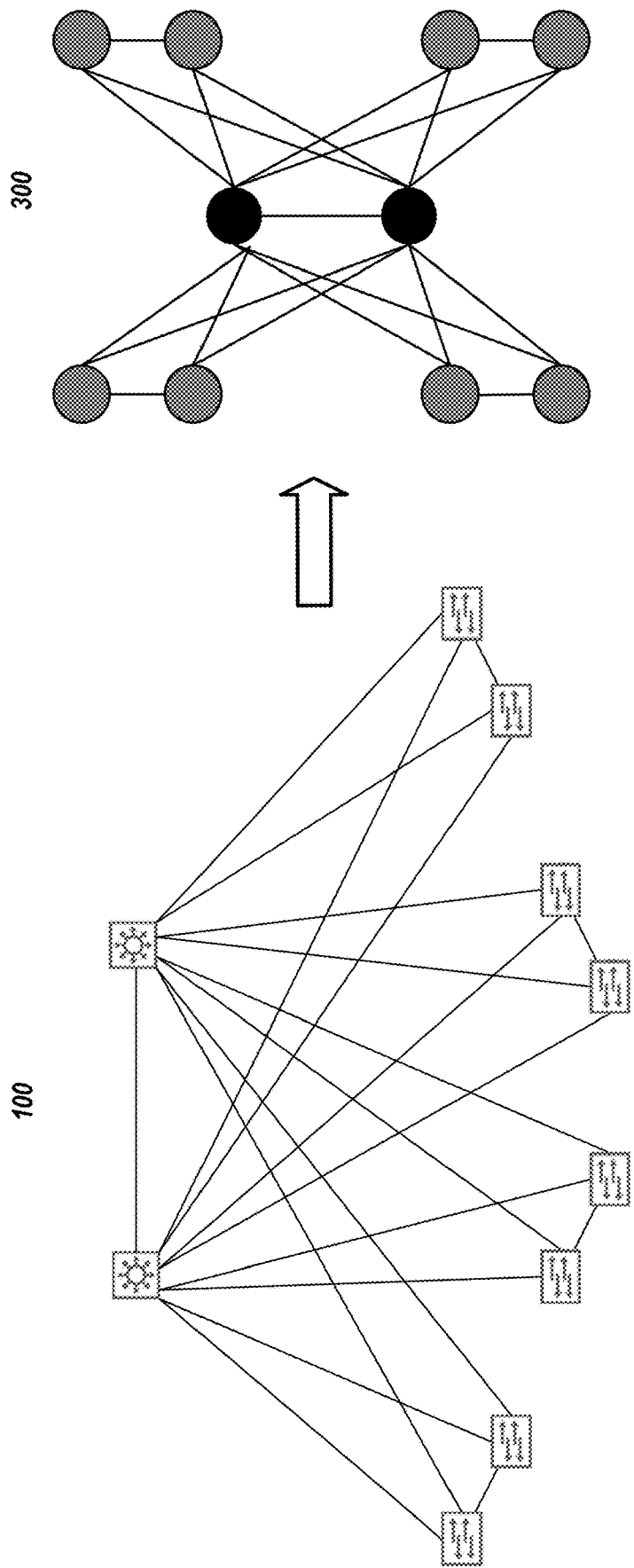
FIG. 3 depicts the graphical representation of a wiring diagram and graphically depicts a corresponding multigraph, according to embodiments of the present disclosure.

FIG. 2 depicts a method for training a neural network to analyze a network fabric, according to embodiments of the present disclosure. In one or more embodiments, a network fabric wiring diagram is converted (205) into an undirected multigraph, in which information handling systems (i.e., network fabric elements/devices) are nodes/vertices of the multigraph and the links that connect the devices are the edges of the multigraph. In one or more embodiments, there can be multiple edges with unique attributes between two nodes. FIG. 3 depicts the graphical representation of the wiring diagram 100 from FIG. 1 and graphically depicts a corresponding multigraph 300, according to embodiments of the present disclosure.

In one or more embodiments, an adjacency matrix Â (Â∈ $\mathbb{R}^{n \times n}$) is generated (210) to represent the multigraph. In one or more embodiments, the adjacency matrix is an n×n matrix, where n is the number of nodes in the multigraph. The adjacency matrix may be augmented or include (215) information related to edge features or attributes, such as link type, link speed, number of links connected between two nodes, etc.

Figure 4:
FIG. 4 depicts an adjacency matrix for a multigraph, according to embodiments of the present disclosure.
Figure 5:
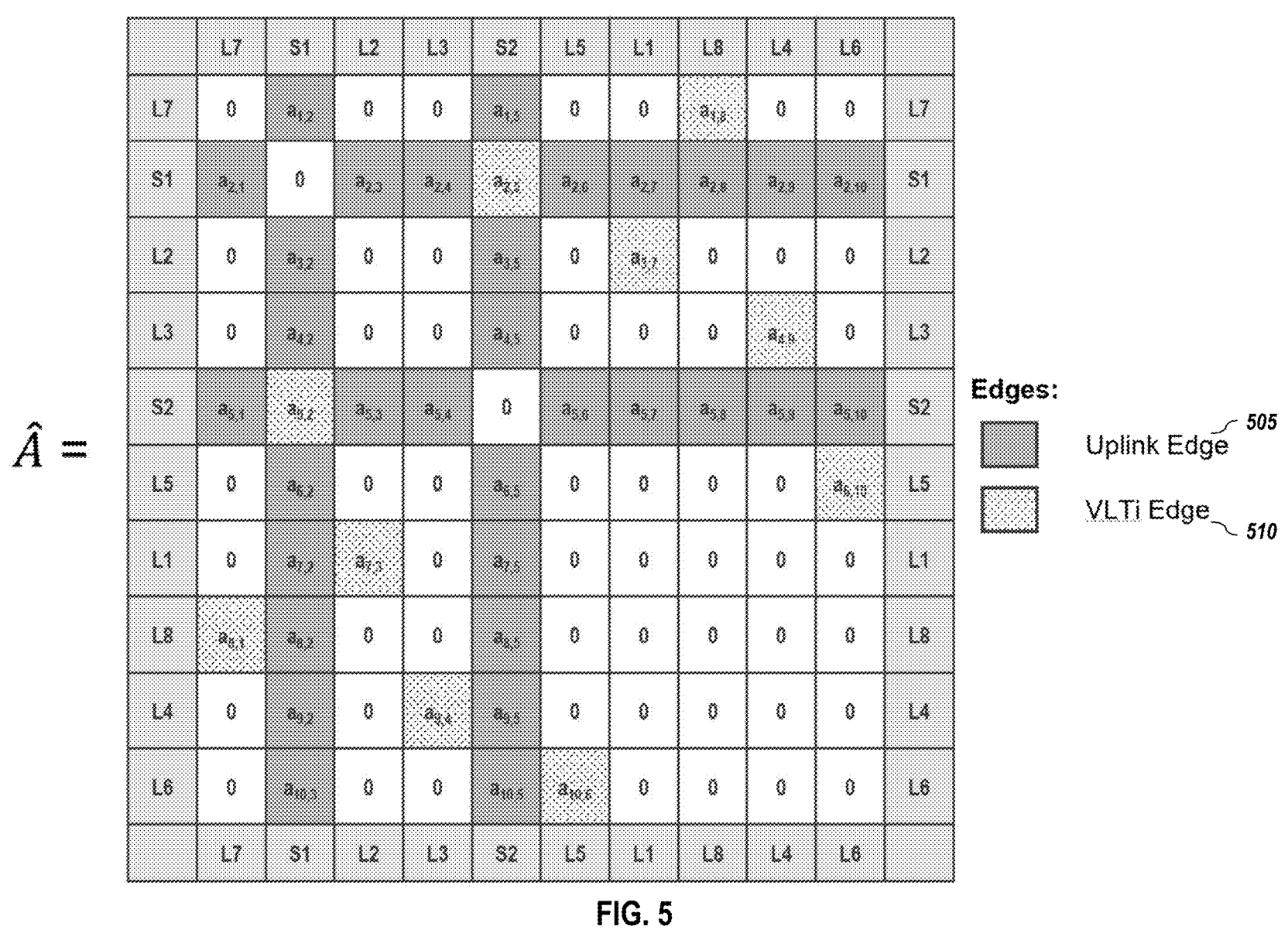

FIG. 4 depicts an adjacency matrix 400 for the multigraph 300, according to embodiments of the present disclosure. Note that rows and columns represent the nodes of the graph 300 (i.e., the spine nodes 105 and the leaf nodes 110) and the cells represent the connections between nodes. In one or more embodiments, each cell of the adjacency matrix may comprise a numerical representation for the edge features of a link connection or connections between two nodes. For example, the edge connection between spine-1 (S1) and leaf-7 (L7) may be reflected in a numerical representation, $a_{1,2}$ 405; and, where no edge connection exists, it may be represented by zero (e.g., cell 410 represents that there is no direct connection between leaf-6 and leaf-7). As illustrated graphically in FIG. 5, the numeric feature representations in the cells may include a number of factors, including type of connection. By way of illustration, the feature representation may include whether a link is an uplink edge 505 or a VLTi edge 510 link. In FIG. 5, for sake of graphic depiction, the different edge link types are identified via different shape patterns.

In one or more embodiments, a degree matrix, D (D∈ $\mathbb{R}^{n \times n}$) which is an n×n diagonal matrix, that represents degree of each node in the multigraph is created (220). In one or more embodiments, degree represents the number of links of a node, which may consider bi-directional links as two separate links, or in embodiments, may treat them as a single link. FIG. 6 depicts an example degree matrix 600 for the multigraph 300, according to embodiments of the present disclosure. For example, the degree of leaf-7 is 3 605, in which bi-directional links were not separately counted in this example.

In one or more embodiments, the adjacency matrix, A, and the degree matrix, D, may be combined and normalized (225) to build a normalized adjacency matrix A that will be used as an input to train the neural network. In one or more embodiments, the following formula may be used to obtain the normalized adjacency matrix:

$$A = D^{-\frac{1}{2}} \cdot \hat{A} \cdot D^{-\frac{1}{2}}$$

Figure 7:
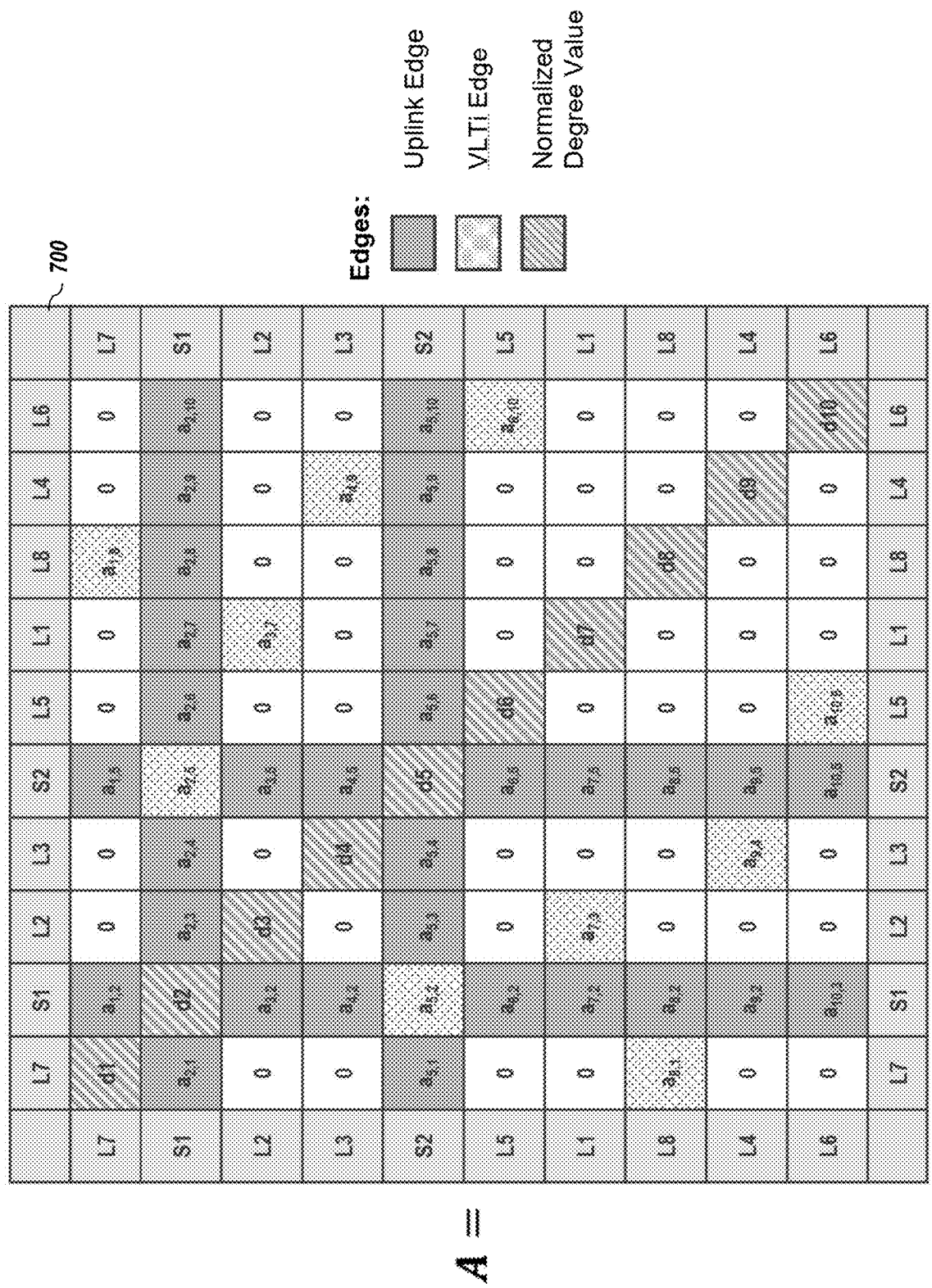
FIG. 7 depicts a normalized adjacency matrix A for a multigraph, according to embodiments of the present disclosure.

FIG. 7 depicts a normalized adjacency matrix, A 700, for the multigraph 300, according to embodiments of the present disclosure.

In one or more embodiments, a feature matrix is created (230) for the nodes of the network fabric. FIG. 8 depicts a method for building a feature matrix, according to embodiments of the present disclosure. In one or more embodiments, for each node in the multigraph, features are extracted (805) to create a feature vector, $v_i$ ($v_i \in \mathbb{R}^{1 \times d}$), where dimension d of feature vector $v_i$ is the number of features used. In one or more embodiments, the same number of features for all nodes, but it shall be noted that different numbers and different types of features may be used for different nodes. For example, nodes of a certain type or class may have the same set of features but that set of features may be different for nodes of a different type or class.

Figure 9:
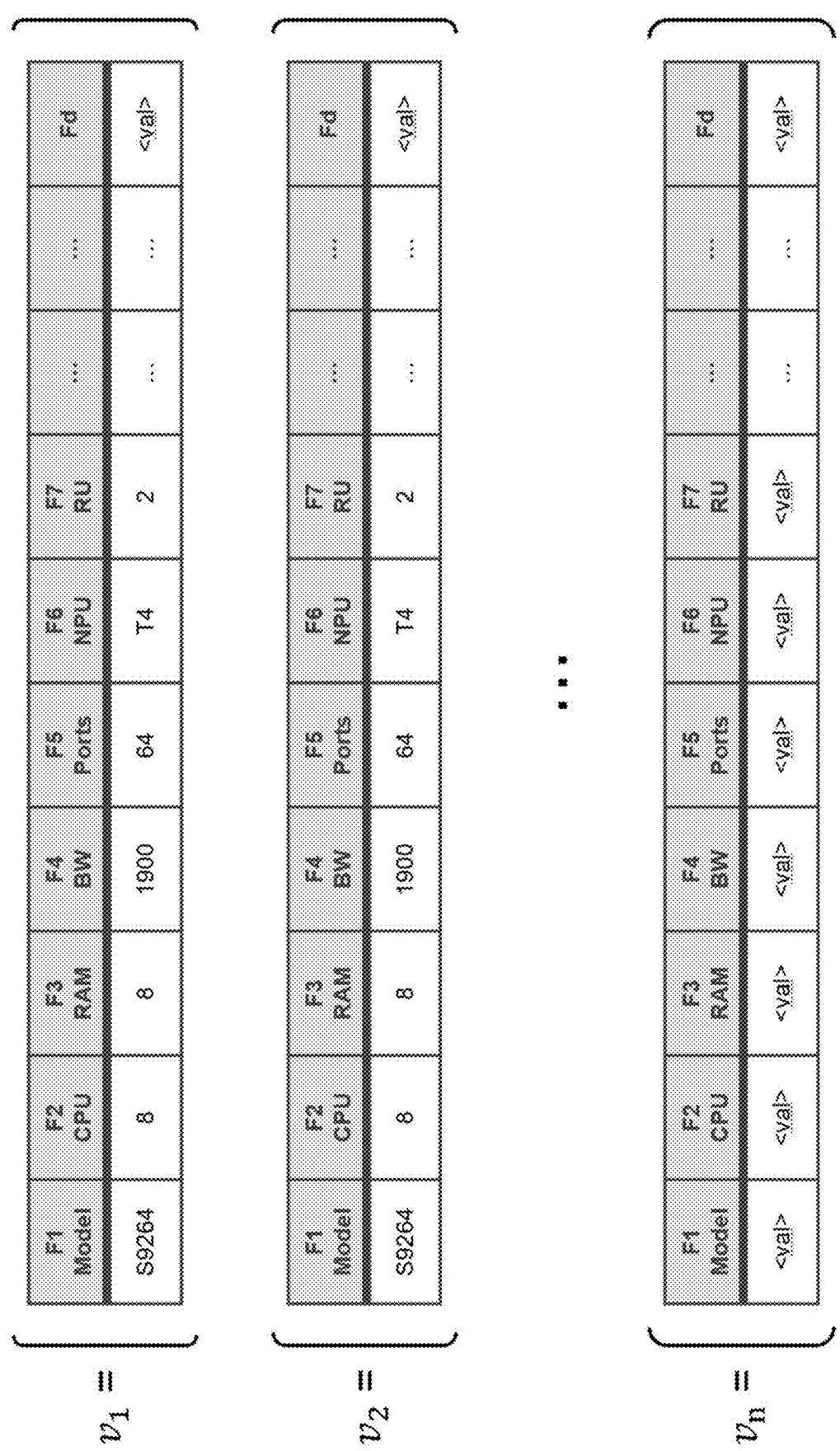
FIG. 9 depicts some example features for a network fabric node, according to embodiments of the present disclosure.

FIG. 9 depicts some example features for a network fabric node, according to embodiments of the present disclosure. In one or more embodiments, node features may comprise a number of elements, such as, device model, central processor unit (CPU) type, network processor unit (NPU) type, number of CPU cores, Random Access Memory (RAM) size, number of 100 G, 50 G, 25 G, 10 G ports, rack unit size, operation system version, end-of-life date for product, etc. It shall be noted that any attribute of the node may be used as feature; categorical (e.g., nominal, ordinal) features may be converted into numeric features using label encoders, one-hot vector encoding, or other encoding methodologies.

Returning to FIG. 8, the feature vectors for all of the nodes in the network may be combined (810) to create a feature matrix, X, that represents all features from all nodes. In one or more embodiments, the feature matrix is an n×d matrix (X $\in \mathbb{R}^{n \times d}$). FIG. 10 graphically depicts a feature matrix 1000, according to embodiments of the present disclosure.

Figure 11:
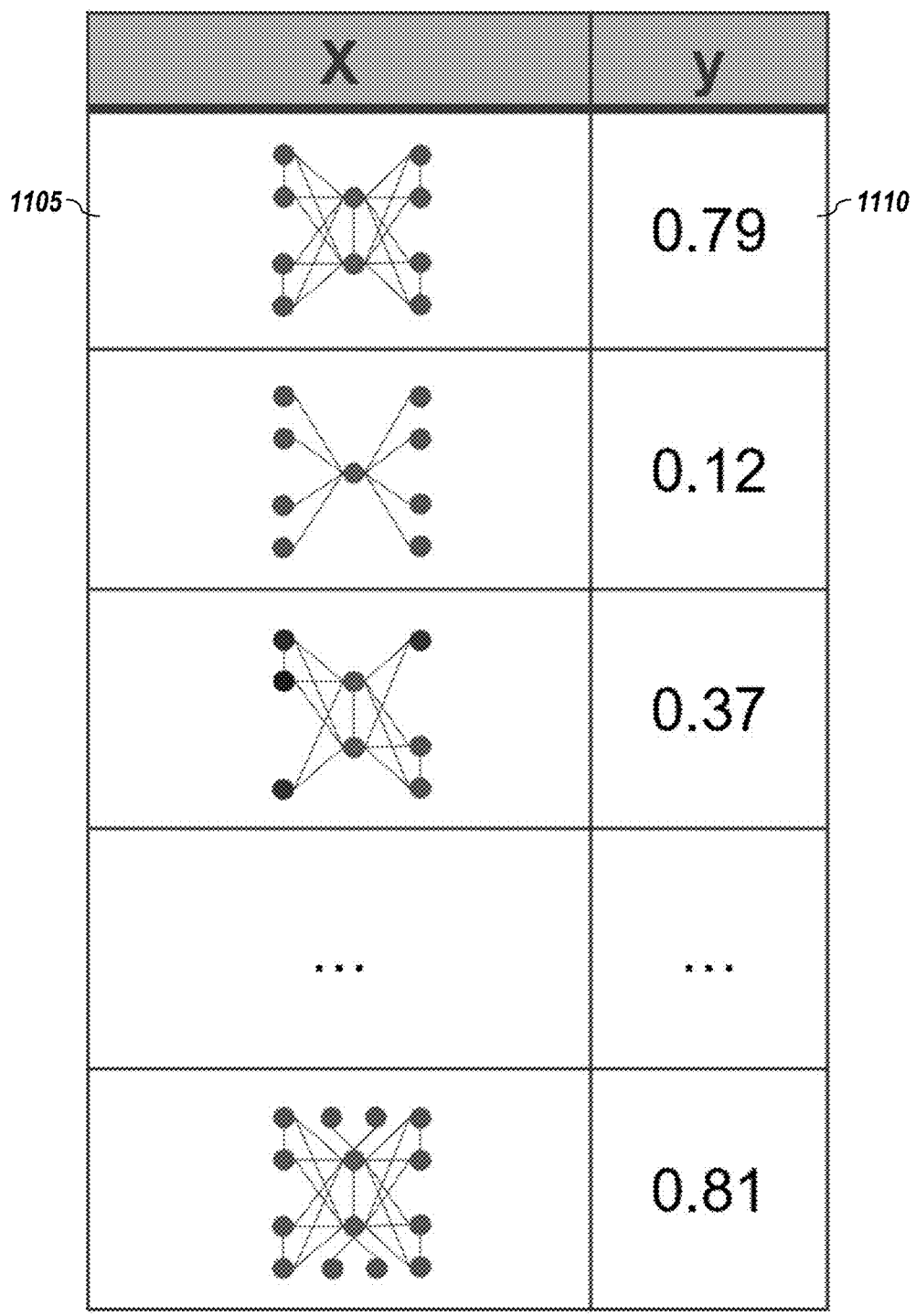
FIG. 11 graphically depicts a training dataset, according to embodiments of the present disclosure.

Returning to FIG. 2, in one or more embodiments, the process of steps 200-230 may be repeated for a number of different network fabric designs, thereby generating a set of feature matrices and their corresponding adjacency matrices. In one or more embodiments, validity/quality scores may be assigned or obtained for the network fabric designs by experts, by experience with how implemented network fabrics have performed, or combinations thereof. These scores may be used as corresponding ground truth scores for training a neural network. In experiments performed on an embodiment, a dataset of over a 1000 wiring diagrams was generated using permutations of commonly used topologies in development and deployment. FIG. 11 graphically depicts a training dataset in which a feature matrix, X, for each wiring diagram (graphically illustrated in FIG. 11, see, e.g., 1105) has a corresponding quality/validity score 1110, according to embodiments of the present disclosure. Thus, for the training data, every data point in the dataset is a tuple (X, y), wherein X: a feature matrix obtained from an input wiring-diagram multigraph; and y: Score In compiling the dataset, a variety of node values and link values were used for generating wiring-diagrams multi-graphs. Examples include:

Node Types: e.g., Dell EMC models Z9264, Z9100, S5264, S5232, S4148, S4128, and S5128;

Graph Size: 11 nodes (2+8+1), 21 nodes (4+16+1), 33 nodes (4+28+1), 65 (6+56+1), in which the format is (spine+leaf+border leaf);

Link Speeds: 100 G, 50 G, and 10 G; and

Link Bandwidth: {2 uplinks, 2 VLTi}, {4 uplinks, 2 VLTi}, {4 uplinks, 4 VLTi}, and {8 uplinks, 4 VLTi}.

In generating the dataset, care was taken to have a uniform distribution of equal numbers of good and not-so-good wiring diagrams. In one or more embodiments, the dataset was divided into 80-10-10 distribution representing training, cross-validation, and testing, respectively.

Returning to FIG. 2, given a test dataset, the feature matrices, adjacency matrices, and ground truth scores are input (235) into a neural network to train the neural network. In one or more embodiments, the neural network may be a Graph Convolution Network (GCN). GCNs are similar to convolutional neural networks (CNNs), except they have an ability to preserve the graph structure without steam-rolling the input data. GCNs utilize the concept of convolutions on graphs by aggregating local neighborhood regional information using multiple filters/kernels to extract high-level representations in a graph. Convolution filters for GCN are inspired by filters in Digital Signal Processing and Graph Signal Processing. They may be categorized in time and space dimensions: (1) spatial filters: combines neighborhood sampling with degree of connectivity k; and (2) spectral filters: uses Fourier transform and Eigen decomposition to aggregate node information.

Figure 12:
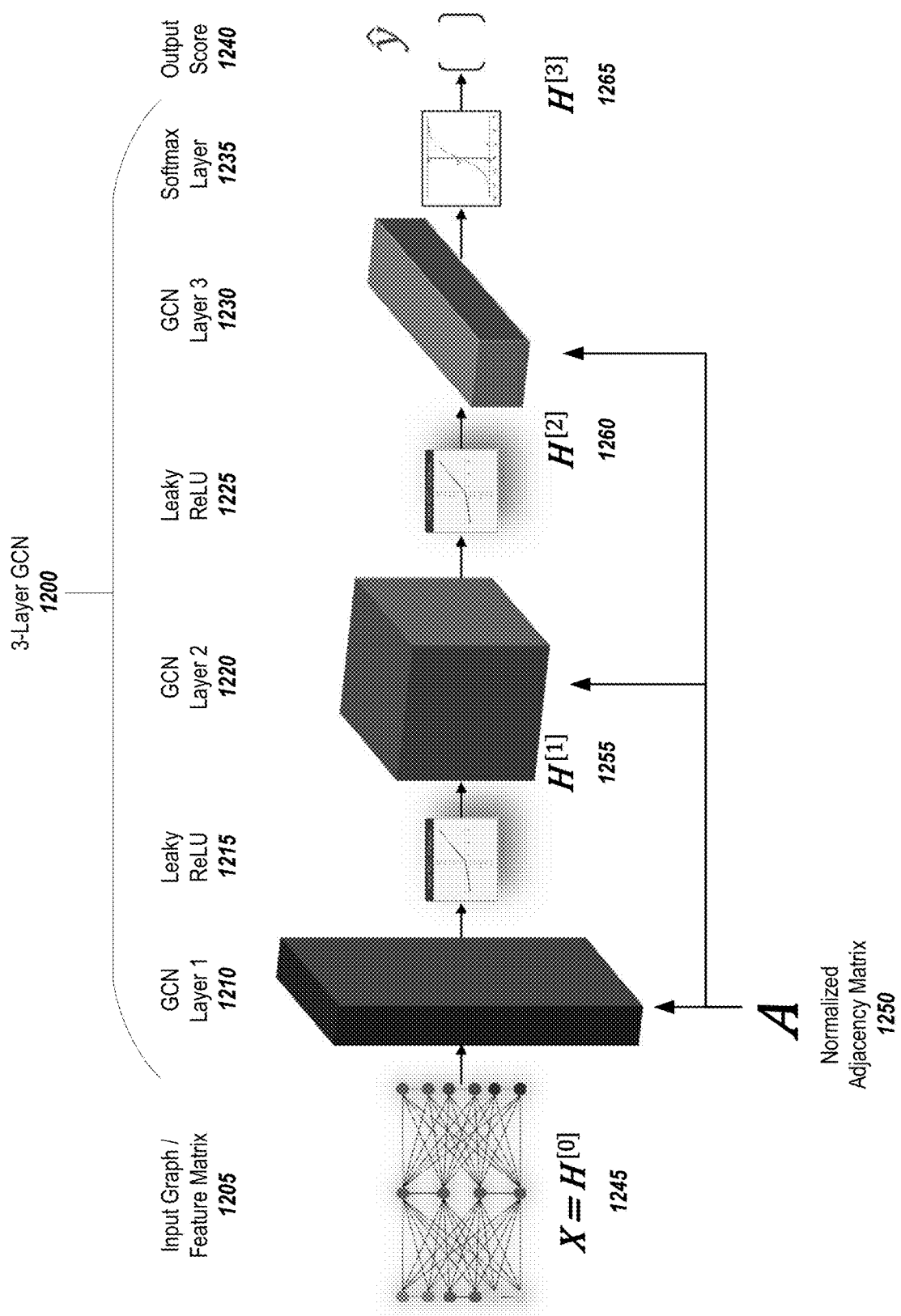
FIG. 12 depicts a Graph Convolution Network (GCN), according to embodiments of the present disclosure.

In one or more embodiments, a 3-layer GCN may used, but it shall be noted that other configurations or different numbers of layers may be used. FIG. 12 depicts a Graph Convolution Network (GCN), according to embodiments of the present disclosure. As illustrated, a feature matrix X 1245 is fed as an input to the GCN 1200, where $H^{[0]}=X$. Also input into the GCN layers (1210, 1220, and 1230) is the normalized adjacency matrix 1250 corresponding to the input feature matrix The GCN layer 1210 performs convolutions on the input using predefined filters and generates an output with a dimension different from that of the input. The input for the next layer 1220 may be represented as:

$$H^{[1]}=\sigma(A \cdot H^{[0]} \cdot W^{[0]}+b^{[0]})$$

where:

$H^{[l]}$: Hidden layer output of layer-l

A: Normalized Multigraph Adjacency Matrix $W^{[l]}$: Weight Matrix at layer-l (Model parameter)

$b^{[l]}$: Bias term at layer-l (Model parameter)

σ: Non-linear function (e.g., Leaky-ReLU 1215 and 1225)

A general formula for generating convolutions on the graph at any level may be expressed as:

$$H^{[l]}=\sigma(A \cdot H^{[l-1]} \cdot W^{[l-1]}+b^{[l-1]})$$

In particular, processing pipeline for the 3-layer GCN depicted in FIG. 12 may be summarized in following equations:

$$H^{[0]}=X$$

$$H^{[1]}=\sigma(A \cdot H^{[0]} \cdot W^{[0]}+b^{[0]})$$

$$H^{[2]}=\sigma(A \cdot H^{[1]} \cdot W^{[1]}+b^{[1]})$$

$$H^{[3]}=\sigma(A \cdot H^{[2]} \cdot W^{[2]}+b^{[2]})$$

$$\hat{y}=\text{softmax}(H^{[3]})$$

After flowing through multiple GCN layers 1210, 1220, and 1230 with different convolution filters, the hidden layer output of last layer is fed into a softmax non-linear function 1235 that produces a probability distribution of possible score values summing to 1.

$$\hat{y}=\text{softmax}(H^{[l]})$$

where:

$H^{[l]}$: Hidden layer output of final layer

ŷ: Predicted score softmax: Non-linear function (softmax)

In one or more embodiments, these scores may be used as predicted score, in which the particular category with the highest score may be selected as the output category. For training, the score may be compared to the ground truth score to compute a loss. The losses may be used to update one or more parameters of the GCN, using, for example, gradient descent.

In one or more embodiments, the training process may be repeated until a stop condition has been reached. In one or more embodiments, a stop condition may include: (1) a set number of iterations have been performed; (2) an amount of processing time has been reached; (3) convergence (e.g., the difference between consecutive iterations is less than a first threshold value); (4) divergence (e.g., the performance deteriorates); (5) an acceptable outcome has been reached; and (6) a set or sets of data have been fully processed. After training has completed, a trained GCN is output. As explained in the next section, the trained GCN model may be used for predicting the validity/quality of a wiring diagram for a network fabric design.

2. Prediction Embodiments

Figure 13:
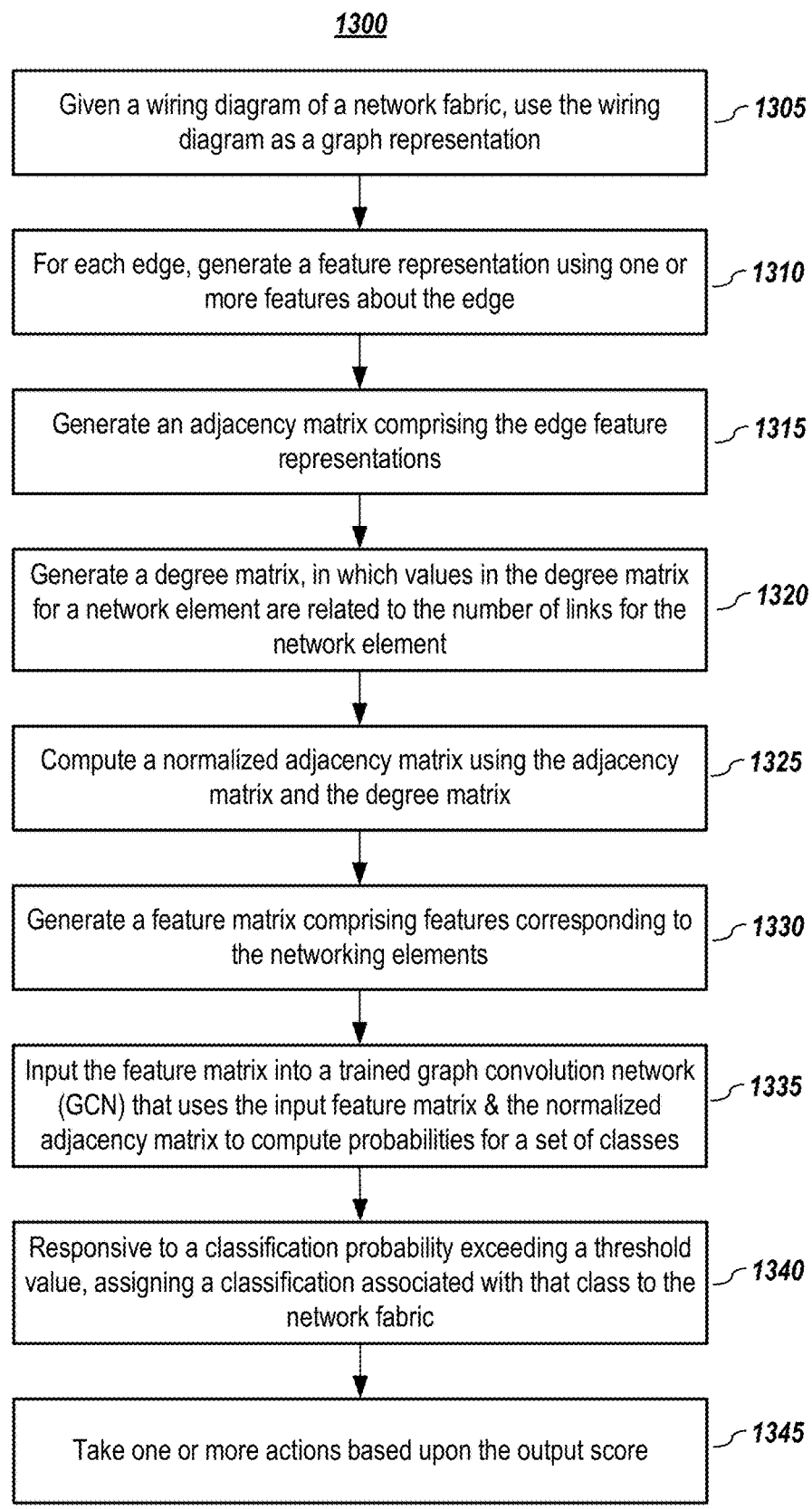
FIG. 13 depicts a method for using a trained neural network to analyze a network fabric, according to embodiments of the present disclosure.

FIG. 13 depicts a method for using a trained neural network to analyze a network fabric, according to embodiments of the present disclosure. In one or more embodiments, given a wiring diagram comprise representations of a network fabric comprising a plurality of networking elements and connections between the networking elements, the wiring diagram may be used as or converted (1305) into a graph representation, in which a networking element is a node in the graph representation and a connection or link between networking elements is an edge in the graph representation. For each edge, a feature representation is generated (1310) using one or more features about the edge. In like manner as described above for the training, the features related to the links may be used to generate a feature representation for the link. The feature representations for the edges of the graph may then be compiled (1315) into an adjacency matrix.

A degree matrix is also created (1320). In one or more embodiments, the degree value for a network element represents its number of connections.

In one or more embodiments, the adjacency matrix and the degree matrix are used (1325) to compute a normalized adjacency matrix, which may be computed using:

$$A = D^{-\frac{1}{2}} \cdot \hat{A} \cdot D^{-\frac{1}{2}},$$

where
A=the adjacency matrix; and
D=the degree matrix.

In like manner as for the training process, for each networking element, a feature representation is generated using one or more features about or related to the networking element. For the network fabric, the feature representations for the networking elements may be formed (1330) into a feature matrix. In one or more embodiments, the feature matrix comprises a feature representation for each network element in the network fabric.

In one or more embodiments, the feature matrix is input (1335) into a trained graph convolution network (GCN) that uses the input feature matrix and the normalized adjacency matrix to compute a classification probability for each class from a set of classes. Responsive to a classification probability exceeding a threshold value, a classification associated with that class is assigned (1340) to the network fabric. As noted previously, the classification classes may be generalized categories (e.g., green (good/acceptable), yellow (caution/potential issues), or red (do not use/critical issues)). Additionally, or alternatively, the neural network may comprise a set of neural networks that provide multiclass classification in which each identified class specifies a certain issue. For example, there may be classes related to missing links, poor redundancy, missing a fabric element, wrong configuration, incompatibility of devices or links, capacity issues, etc.

In any event, depending upon the assigned classification, one or more actions may be taken (1345). Action may include deploying the network fabric as designed. Corrective actions may include redesigning the network fabric to correct for one or more defects, which may be identified by the assigned classification.

In one or more embodiments, appropriate or corrective actions may include a design audit by an advanced services team (i.e., expert(s) in the field) for new recommendations. The audit may be performed at various degree of complexity and may involve checking for the presence of common issues, for example: (a) checking all devices in the topology for end-of-life date; (b) checking if there is sufficient redundancy in the design (i.e., every leaf/spine is a pair); (c) checking connection bandwidth between leaf-pairs and spine-pairs to ensure sufficiency; (d) checking if a border leaf is present; and (e) checking to see if the devices are being used appropriately based on their capability (i.e., low-end device should not be used as a spine device). Alternatively, or additionally, identified classes of issues may be used to correct issues in the design, which may be fixed programmatically based upon the identified issues.

In tests, it was found that the trained model performed extremely well on all objective tasks of determining incomplete or incorrect topologies, incompatible equipment, and missing connections.

Initial latent design issues (e.g., Day-0 issues) may manifest themselves as problems during Day-N deployment and beyond. These initially undetected latent issues may have a significant delay in deployment and increase in operation expenses. For example, a single issue with wiring diagram for an initial release may require the whole virtual appliance to be redeployed from scratch. Thus, embodiments herein help the deployment engineer identify problems associated with creating physical wiring diagram. Furthermore, as compared with any rule-based system or expert-based approach, embodiments provide several benefits:

Scalability: Due to the number of permutations in the graph, a rule-based system would require millions of rules, which is impractical, if not impossible, to produce and is not scalable. In comparison, an embodiment has a fixed set of parameters and is spatially invariant; it learns high dimensional patterns from training examples to give predictions.

Adaptability: The nature of the problem is such that it may be said that there are no fixed "good" or "bad" wiring diagram. For example, a moderate bandwidth device deployed in a high capacity, high-bandwidth fabric is less desirable than deploying the same switch in a small-scale fabric. Embodiment adapts to the overall context of the fabric to predict a score of the viability of such a deployment.

Performance: Neural network models, such as GCNs, performed very well on all objective tasks. Furthermore, tests performed on an embodiment provided superior performance.

Continued Improvement: As more data become available, the neural network model may be retrained for improved classification and/or may be augmented to learn additional classifications.

Wide deployment and usage: A trained neural model can be readily and widely deployed. Thus, less skilled administrators can use the trained neural model and receive the benefits that would otherwise be unavailable to them given their limited experience with network fabric deployments.

Ease of usage and time savings: A trained neural model can be easily deployed and used. Furthermore, once trained, it is very inexpensive to have the model operated on a writing diagram. Thus, as networks evolve, it is easy, fast, and cost effective to gauge the quality of these changed network designs.

C. System Embodiments

In one or more embodiments, aspects of the present patent document may be directed to, may include, or may be implemented on one or more information handling systems (or computing systems). An information handling system/computing system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data. For example, a computing system may be or may include a personal computer (e.g., laptop), tablet computer, mobile device (e.g., personal digital assistant (PDA), smart phone, phablet, tablet, etc.), smart watch, server (e.g., blade server or rack server), a network storage device, camera, or any other suitable device and may vary in size, shape, performance, functionality, and price. The computing system may include random access memory (RAM), one or more processing resources such as a central processing unit (CPU) or hardware or software control logic, read only memory (ROM), and/or other types of memory. Additional components of the computing system may include one or more disk drives, one or more network ports for communicating with external devices as well as various input and output (I/O) devices, such as a keyboard, mouse, stylus, touchscreen, and/or video display. The computing system may also include one or more buses operable to transmit communications between the various hardware components.

Figure 14:
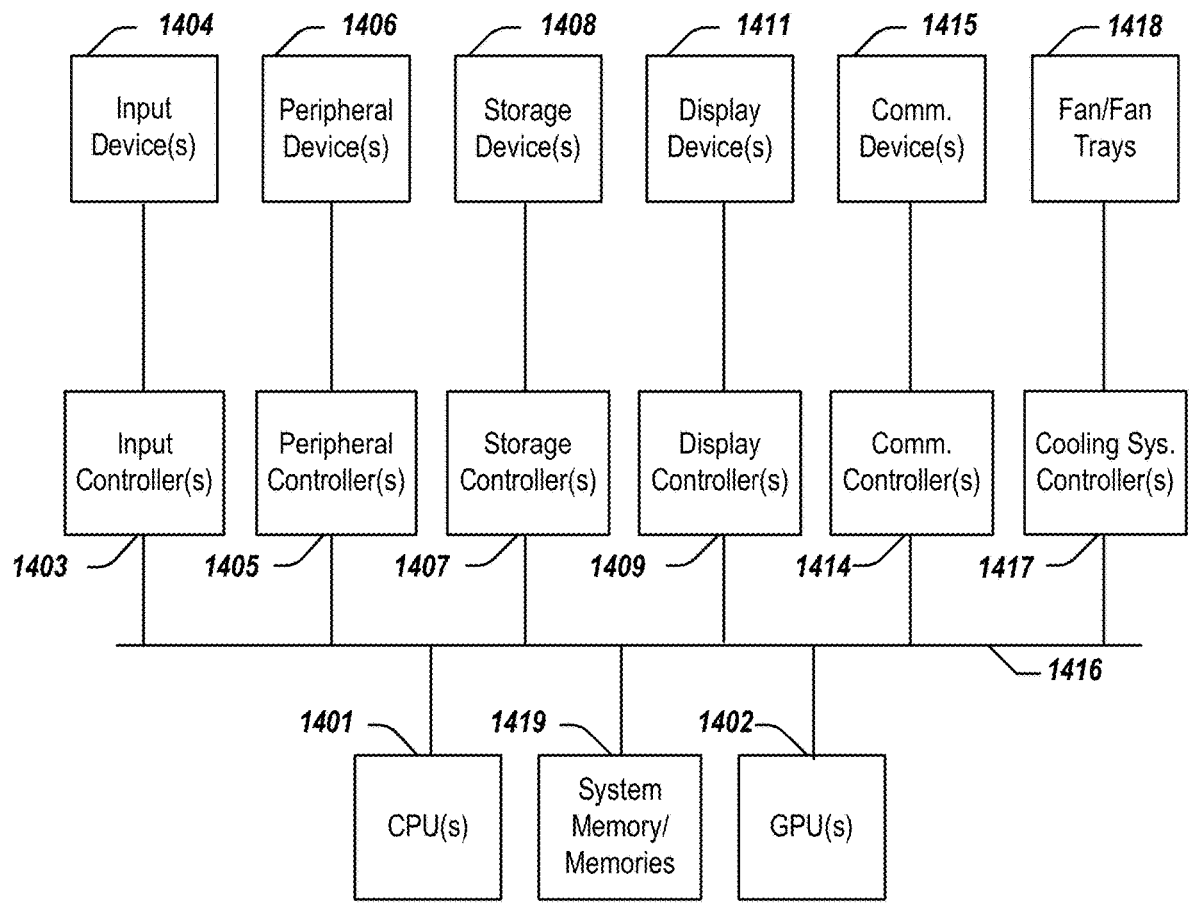
FIG. 14 depicts a simplified block diagram of an information handling system, according to embodiments of the present disclosure.

FIG. 14 depicts a simplified block diagram of an information handling system (or computing system), according to embodiments of the present disclosure. It will be understood that the functionalities shown for system 1400 may operate to support various embodiments of a computing system—although it shall be understood that a computing system may be differently configured and include different components, including having fewer or more components as depicted in FIG. 14.

As illustrated in FIG. 14, the computing system 1400 includes one or more central processing units (CPU) 1401 that provides computing resources and controls the computer. CPU 1401 may be implemented with a microprocessor or the like and may also include one or more graphics processing units (GPU) 1402 and/or a floating-point coprocessor for mathematical computations. In one or more embodiments, one or more GPUs 1402 may be incorporated within the display controller 1409, such as part of a graphics card or cards. The system 1400 may also include a system memory 1419, which may comprise RAM, ROM, or both.

A number of controllers and peripheral devices may also be provided, as shown in FIG. 14. An input controller 1403 represents an interface to various input device(s) 1404, such as a keyboard, mouse, touchscreen, and/or stylus. The computing system 1400 may also include a storage controller 1407 for interfacing with one or more storage devices 1408 each of which includes a storage medium such as magnetic tape or disk, or an optical medium that might be used to record programs of instructions for operating systems, utilities, and applications, which may include embodiments of programs that implement various aspects of the present disclosure. Storage device(s) 1408 may also be used to store processed data or data to be processed in accordance with the disclosure. The system 1400 may also include a display controller 1409 for providing an interface to a display device 1411, which may be a cathode ray tube (CRT) display, a thin film transistor (TFT) display, organic light-emitting diode, electroluminescent panel, plasma panel, or any other type of display. The computing system 1400 may also include one or more peripheral controllers or interfaces 1405 for one or more peripherals 1406. Examples of peripherals may include one or more printers, scanners, input devices, output devices, sensors, and the like. A communications controller 1414 may interface with one or more communication devices 1415, which enables the system 1400 to connect to remote devices through any of a variety of networks including the Internet, a cloud resource (e.g., an Ethernet cloud, a Fiber Channel over Ethernet (FCoE)/Data Center Bridging (DCB) cloud, etc.), a local area network (LAN), a wide area network (WAN), a storage area network (SAN) or through any suitable electromagnetic carrier signals including infrared signals. As shown in the depicted embodiment, the computing system 1400 comprises one or more fans or fan trays 1418 and a cooling subsystem controller or controllers 1417 that monitors thermal temperature(s) of the system 1400 (or components thereof) and operates the fans/fan trays 1418 to help regulate the temperature.

In the illustrated system, all major system components may connect to a bus 1416, which may represent more than one physical bus. However, various system components may or may not be in physical proximity to one another. For example, input data and/or output data may be remotely transmitted from one physical location to another. In addition, programs that implement various aspects of the disclosure may be accessed from a remote location (e.g., a server) over a network. Such data and/or programs may be conveyed through any of a variety of machine-readable medium including, for example: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, other non-volatile memory (NVM) devices (such as 3D XPoint-based devices), and ROM and RAM devices.

Figure 15:
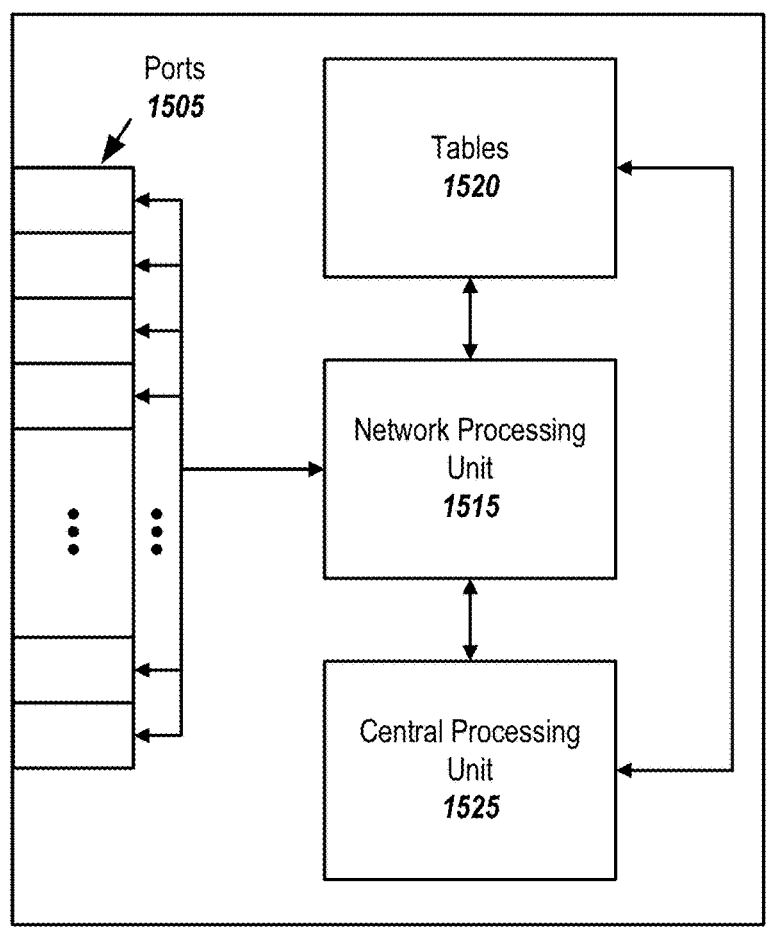
FIG. 15 depicts an alternative block diagram of an information handling system, according to embodiments of the present disclosure.

FIG. 15 depicts an alternative block diagram of an information handling system, according to embodiments of the present disclosure. It will be understood that the functionalities shown for system 1500 may operate to support various embodiments of the present disclosure—although it shall be understood that such system may be differently configured and include different components, additional components, or fewer components.

The information handling system 1500 may include a plurality of I/O ports 1505, a network processing unit (NPU) 1515, one or more tables 1520, and a central processing unit (CPU) 1525. The system includes a power supply (not shown) and may also include other components, which are not shown for sake of simplicity.

In one or more embodiments, the I/O ports 1505 may be connected via one or more cables to one or more other network devices or clients. The network processing unit 1515 may use information included in the network data received at the node 1500, as well as information stored in the tables 1520, to identify a next device for the network data, among other possible activities. In one or more embodiments, a switching fabric may then schedule the network data for propagation through the node to an egress port for transmission to the next destination.

Aspects of the present disclosure may be encoded upon one or more non-transitory computer-readable media with instructions for one or more processors or processing units to cause steps to be performed. It shall be noted that the one or more non-transitory computer-readable media shall include volatile and/or non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present disclosure may further relate to computer products with a non-transitory, tangible computer-readable medium that have computer code thereon for performing various computer-implemented operations. The media and computer code may be those specially designed and constructed for the purposes of the present disclosure, or they may be of the kind known or available to those having skill in the relevant arts. Examples of tangible computer-readable media include, for example: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, other non-volatile memory (NVM) devices (such as 3D XPoint-based devices), and ROM and RAM devices. Examples of computer code include machine code, such as produced by a compiler, and files containing higher level code that are executed by a computer using an interpreter. Embodiments of the present disclosure may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present disclosure. One skilled in the art will also recognize that a number of the elements described above may be physically and/or functionally separated into modules and/or sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A computer-implemented method for predicting a classification of a network fabric design, the method comprising:

given a feature matrix and a corresponding adjacency matrix obtained from a graph representation of a wiring diagram of the network fabric design, which comprises a plurality of networking elements and network-related connections between two or more networking elements, inputting the feature matrix and the corresponding adjacency matrix of the network fabric design into a trained graph convolution network (GCN) model, which was trained by performing steps comprising:

obtaining a set of feature matrices and a set of adjacency matrices corresponding to a set of training wiring diagrams, in which, for each training wiring diagram of a set of training wiring diagrams, its feature matrix and its adjacency matrix were obtained by performing steps comprising:

given the training wiring diagram of a network fabric design comprising a plurality of networking elements, which are functional systems or devices, and network-related connections between networking elements, using the training wiring diagram as a graph representation, in which a networking element is a node and a connection between networking elements is an edge;

for each edge, generating an edge feature representation using one or more features about the edge;

generating an adjacency matrix using the edge feature representations;

generating a degree matrix, which represents, for a networking element, its number of connections;

computing a normalized adjacency matrix using the adjacency matrix and the degree matrix;

for each networking element, generating a feature representation using one or more features about the networking element; and using the feature representations of the networking elements to form a feature matrix;

iterating until a stop condition is reached steps comprising:

inputting at least some of the set of feature matrices and at least some of the set of corresponding adjacency matrices into a graph convolution network (GCN) model that uses a feature matrix and a corresponding normalized adjacency matrix to determine a predicted classification of a set of classes regarding the network fabric design corresponding to the feature matrix and the corresponding normalized adjacency matrix;

computing a loss using a ground truth classification for the network fabric design and the predicted classification for the network fabric design; and updating one or more parameters of the GCN model using the loss; and responsive to a stop condition being reached, outputting the trained GCN model for classifying a network fabric design; and outputting a classification of the network fabric design based upon a prediction of the trained GCN model.

2. The computer-implemented method of claim 1 wherein the step of, for each edge, generating an edge feature representation using one or more features about the edge, comprises:

identifying a set of attributes related to the edge; and representing the set of attributes in numerical form as the edge feature representation for the edge.

3. The computer-implemented method of claim 1 wherein the step of, generating an adjacency matrix using the edge feature representations, comprises:

using the edge feature representations to generate an adjacency matrix, in which each row represents a networking element, each column represents a networking element, and a value in a row and column intersection represents a connection between the networking elements represented by that row and that column and the value is related to the edge feature representation.

4. The computer-implemented method of claim 1 wherein the graph convolution network comprises at least two graph convolution layers.

5. The computer-implemented method of claim 1 wherein the set of classes comprises:
- a first class that represents that the network fabric design is acceptable;
- a second class that represents that the network fabric design has one or more potential design issues; and
- a third class that represents the network fabric design has one or more critical design errors.

6. The computer-implemented method of claim 1 wherein the set of classes comprises one or more classifications that relate to a type of design error.

7. The computer-implemented method of claim 1 wherein the step of, for each networking element, generating a feature representation using one or more features about the networking element, comprises:
- identifying a set of attributes related to the networking element; and
- representing the set of attributes in numerical form as the feature representation for the networking element.

8. A computer-implemented method for assigning a classification to a network fabric design comprising:
- given a wiring diagram that comprises a representations of a network fabric design comprising a plurality of networking elements, in which a network element is a functional system or device, and network-related connections between networking elements, using the wiring diagram as a graph representation, in which a networking element is a node in the graph representation and a connection between networking elements is an edge in the graph representation;
- for each edge, generating an edge feature representation using one or more features about the edge;
- generating an adjacency matrix using the edge feature representations;
- generating a degree matrix which represents, for a networking element, its number of connections;
- computing a normalized adjacency matrix using the adjacency matrix and the degree matrix;
- for each networking element, generating a feature representation using one or more features about the networking element;
- using the feature representations from the networking elements of the network fabric design to form a feature matrix;
- inputting the feature matrix into a trained graph convolution network (GCN) that uses the input feature matrix and the normalized adjacency matrix to compute a classification probability for a set of classes regarding the network fabric design; and
- responsive to a classification probability for a class from the set of classes exceeding a threshold value, assigning a classification associated with that class to the network fabric design.

9. The computer-implemented method of claim 8 wherein the step of, for each edge, generating an edge feature representation using one or more features about the edge, comprises:
- identifying a set of attributes related to the edge; and
- representing the set of attributes in numerical form as the edge feature representation for the edge.

10. The computer-implemented method of claim 8 wherein the step of, generating an adjacency matrix using the edge feature representations, comprises:
using the edge feature representations to generate the adjacency matrix, in which each row represents a networking element, each column represents a networking element, and a value in a row and column intersection represents a connection between the networking elements represented by that row and that column and the value is related to the edge feature representation.

11. The computer-implemented method of claim 8 wherein the set of classes comprises:
- a first class that represents that the network fabric design is acceptable;
- a second class that represents that the network fabric design has one or more potential design issues; and
- a third class that represents the network fabric design has one or more critical design errors.

12. The computer-implemented method of claim 8 wherein the set of classes comprises one or more classifications that relate to a type of design error.

13. The computer-implemented method of claim 8 wherein the step of, for each networking element, generating a feature representation using one or more features about the networking element, comprises:
- identifying a set of attributes related to the networking element; and
- representing the set of attributes in numerical form as the feature representation for the networking element.

14. The computer-implemented method of claim 8 wherein the set of classes comprises one or more classifications that relate to a type of design error.

15. The computer-implemented method of claim 8 further comprising the step of:
- modifying the network fabric design based upon the assigned classification.

16. A system for predicting a classification of a network fabric design comprising:
- one or more processors; and
- a non-transitory computer-readable medium or media comprising one or more sets of instructions which, when executed by at least one of the one or more processors, causes steps to be performed comprising:
  - given a feature matrix and a corresponding adjacency matrix obtained from a graph representation of a wiring diagram of the network fabric design, which comprises a plurality of networking elements and network-related connections between two or more networking elements, inputting the feature matrix and the corresponding adjacency matrix of the network fabric design into a trained graph convolution network (GCN) model, which was trained by performing steps comprising:
    - obtaining a set of feature matrices and a set of adjacency matrices corresponding to a set of training wiring diagrams, in which, for each training wiring diagram of a set of training wiring diagrams, its feature matrix and its adjacency matrix were obtained by performing steps comprising:
      - given the training wiring diagram of a network fabric design comprising a plurality of networking elements, which are functional systems or devices, and network-related connections between the networking elements, using the training wiring diagram as a graph representation, in which a networking element is a node and a connection between networking elements is an edge;
      - for each edge, generating an edge feature representation using one or more features about the edge;

generating an adjacency matrix using the edge feature representations;

generating a degree matrix, which represents, for a networking element, its number of connections;

computing a normalized adjacency matrix using the adjacency matrix and the degree matrix;

for each networking element, generating a feature representation using one or more features about the networking element; and using the feature representations of the networking elements to form a feature matrix;

iterating until a stop condition is reached steps comprising:

inputting at least some of the set of feature matrices and at least some of the set of corresponding adjacency matrices into a graph convolution network (GCN) model that uses a feature matrix and a corresponding normalized adjacency matrix to determine a predicted classification of a set of classes regarding the network fabric design corresponding to the feature matrix and the corresponding normalized adjacency matrix;

computing a loss using a ground truth classification for the network fabric design and the predicted classification for the network fabric design; and updating one or more parameters of the GCN model using the loss; and responsive to a stop condition being reached, outputting the trained GCN model for classifying a network fabric design; and outputting a classification of the network fabric design based upon a prediction of the trained GCN model.

17. The system of claim 16 wherein the step of, generating an adjacency matrix using the edge feature representations, comprises:

using the edge feature representations to generate an adjacency matrix, in which each row represents a networking element, each column represents a networking element, and a value in a row and column intersection represents a connection between the networking elements represented by that row and that column and the value is related to the edge feature representation.

18. The system of claim 16 wherein the set of classes comprises:

a first class that represents that the network fabric design is acceptable;

a second class that represents that the network fabric design has one or more potential design issues; and a third class that represents the network fabric design has one or more critical design errors.

19. The system of claim 16 wherein the set of classes comprises one or more classifications that relate to a type of design error.

20. The system of claim 16 wherein the step of, for each networking element, generating a feature representation using one or more features about the networking element, comprises:

identifying a set of attributes related to the networking element; and representing the set of attributes in numerical form as the feature representation for the networking element.

* * * * *